United States Patent [19]
Herman

[11] Patent Number: 4,779,126
[45] Date of Patent: Oct. 18, 1988

[54] OPTICALLY TRIGGERED LATERAL THYRISTOR WITH AUXILIARY REGION

[75] Inventor: Thomas Herman, Redondo Beach, Calif.

[73] Assignee: International Rectifier Corporation, Los Angeles, Calif.

[21] Appl. No.: 908,867

[22] Filed: Sep. 12, 1986

Related U.S. Application Data

[63] Continuation of Ser. No. 555,025, Nov. 25, 1983, abandoned.

[51] Int. Cl.$^4$ ............................................. H01L 29/74
[52] U.S. Cl. ....................................... 357/38; 357/30; 357/35; 357/36; 357/51; 357/52; 357/59
[58] Field of Search ...................... 357/38, 38 E, 38 L, 357/38 LA, 59, 52, 52 D, 51, 43, 30, 30 F, 30 I, 35, 39, 13, 36, 53

[56] References Cited

U.S. PATENT DOCUMENTS

| | | | |
|---|---|---|---|
| 3,486,088 | 12/1969 | Gray et al. | 357/38 |
| 3,508,127 | 4/1970 | Bergman et al. | 357/38 X |
| 3,832,732 | 8/1974 | Roberts | 357/38 X |
| 3,878,551 | 4/1975 | Callahan, Jr. | 357/38 X |
| 3,990,091 | 11/1976 | Cresswell et al. | 357/38 |
| 4,003,072 | 1/1977 | Matsushita et al. | 357/38 X |
| 4,146,906 | 3/1979 | Miyata et al. | 357/38 X |
| 4,224,634 | 9/1980 | Svedberg | 357/38 |
| 4,292,550 | 9/1981 | Onda et al. | 357/38 X |
| 4,315,274 | 2/1982 | Fukui et al. | 357/38 |
| 4,354,121 | 10/1982 | Terasawa et al. | 357/38 X |
| 4,414,560 | 11/1983 | Libow | 357/39 |
| 4,437,107 | 3/1984 | Jonsson et al. | 357/38 |
| 4,467,519 | 8/1984 | Glang et al. | 357/51 X |
| 4,502,070 | 2/1985 | Leipold et al. | 357/38 |
| 4,502,071 | 2/1985 | Herberg | 357/38 |
| 4,613,884 | 9/1986 | Angerstein et al. | 357/35 X |

FOREIGN PATENT DOCUMENTS

| | | | |
|---|---|---|---|
| 2348254 | 8/1975 | Fed. Rep. of Germany | 357/38 L |
| 2909795 | 9/1979 | Fed. Rep. of Germany | 357/38 L |

Primary Examiner—Andrew J. James
Assistant Examiner—William A. Mintel
Attorney, Agent, or Firm—Ostrolenk, Faber, Gerb & Soffen

[57] ABSTRACT

An optically triggered lateral thyristor consists of a plurality of individual lateral thyristor elements connected in parallel. Each element has an active base region which contains a respective cathode region. Each of the base regions is carried in a common conductivity type body. Extending fingers of a continuous anode electrode partly enclose each individual base region to enable the parallel connection of the individual devices. The thyristor base and emitter zones are surrounded by an auxiliary P region which is resistively connected to a field plate and the cathode electrode to improve emitter collection efficiency. The cathode electrode and anode electrode are interdigitated. The cathode electrode is connected to spaced, parallel, generally rectangular emitter regions which are disposed in respective bases between loops of the cathode electrode. Radiation applied to the surface of the device by a noncritical photo source produces the effect of a gate current in order to turn on the device. A resistor, zener diode, capacitor and a plurality of parallel connected MOSFETs are integrated into the chip to define a control circuit for controlling the turn-on of the main lateral thyristor. The anode region may be relatively heavily doped to reduce forward drop. The emitter region surface may be relatively lightly doped to improve injection efficiency of the emitter.

31 Claims, 6 Drawing Sheets

FIG. 4

OPTICALLY TRIGGERED LATERAL THYRISTOR WITH AUXILIARY REGION

This application is a continuation of application Ser. No. 555,025 filed Nov. 25, 1983, now abandoned.

BACKGROUND OF THE INVENTION

This invention relates to thyristors, and more particularly relates to a novel optically triggered lateral thyristor structure which contains integral circuit components for controlling its operation and making it adaptable for use as a solid state relay device.

Solid state relays are known which employ antiparallel connected thyristors and suitable circuit components for controlling the turn-on of the thyristors. Solid state relays of this type are shown in application Ser. No. 451,792, filed Dec. 21, 1982, now U.S. Pat. No. 4,535,251 in the name of Thomas Herman and Oliver Williams, entitled A.C. Solid State Relay Circuit and Structure and assigned to the assignee of the present invention (IR-783).

The circuit of the above application employs two identical thyristor chips connected in anti-parallel circuit relationship. The chips may contain integrally therewith relay control circuit components for enabling turn-on by an optical input when the voltage across the device is less than a given value.

Optically fired lateral thyristor devices are known. Such devices, however, are expensive and have a relatively high forward drop and are relatively insensitive to input radiation. One thyristor device of this type is shown, for example, in U.S. Pat. No. 4,355,320, dated Oct. 19, 1982, entitled Light-Controlled Transistor.

BRIEF DESCRIPTION OF THE INVENTION

The novel thyristor of the invention is formed in a single chip which has a low forward voltage drop and a relatively high current capacity and is highly sensitive to input radiation so that a noncritical LED triggering source can be provided to cause the thyristor to conduct. Relay circuit control components including parallel connected control MOSFETs, a resistor, zener diode and capacitor may also be provided in the single chip. The relay control components permit thyristor turn-on only when the anode-to-cathode voltage is less than a given value. Moreover, false turn-on due to a transient is prevented under all circuit conditions, if the LED is off.

In accordance with the invention, a plurality of individual lateral thyristors, each of which may be optically fired, are connected in parallel with one another. Each lateral thyristor has a respective base with second emitter elements formed in the base. A novel anode region consisting of a plurality of spaced second emitter (e.g. anode) region fingers which lie adjacent an end and two sides of each base make parallel connection of the elements easily possible. The thyristor base zone contains spaced parallel emitter regions and the base zone is surrounded by an auxiliary P region. An auxiliary region for a lateral optically triggered transistor is shown in U.S. Pat. No. 4,355,320. The novel auxiliary regions of the invention, however, loop around and fully enclose the individual base regions and are resistively connected to a conductive polysilicon field plate which is solidly connected to a metallic electrode, which is the cathode for the foregoing doping conductivity types.

The novel resistive connection may be obtained by making spaced connections from the field plate to the auxiliary region. By using a resistive connection in this manner, more carriers which are injected from the second emitter (e.g. anode) region and which travel laterally toward the first emitter will reach the first emitter. This improved the forward drop of the device by a significant amount (for example, from 1.45 volts to 1.15 volts) which significantly decreases power dissipation during the operation of the device.

In accordance with further features of the invention, the second emitter region may be relatively heavily doped in comparison to the first emitter doping to further reduce the forward drop. The emitter doping concentration at the second emitter region surface is also controlled to a point found to be optimum for improving injection efficiency. In particular, very good operation is obtained when using a surface concentration of $1 \times 10^{20}$ to $6 \times 10^{20}$ phosphorus ions/cc at the emitter surface.

Finally, in making the surface contacts for the device, thin lines of relatively thick aluminum are used to expose a maximum amount of silicon.

DETAILED DESCRIPTION OF THE DRAWINGS

Figure 1:
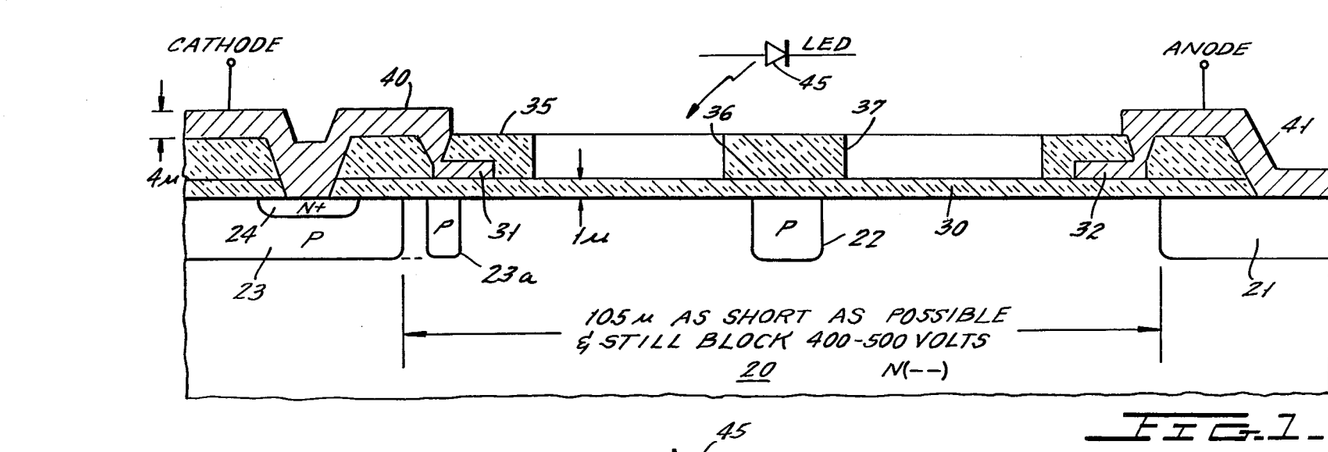
FIG. 1 is a cross-sectional view of the junction pattern of a single lateral thyristor which employs some features of the present invention.

Referring first to FIG. 1, there is shown therein in cross-section the junction pattern and metallizing of a lateral thyristor chip which is manufactured in accordance with some of the principles of the present invention. The chip containing the lateral thyristor of FIG. 1 can have any desired size and configuration, and is a chip of monocrystalline silicon.

The various junctions shown in FIG. 1 are formed in N(— —) layer 20. Layer 20 may have a resistivity of about 20 ohm-centimeters. Spaced P type regions 21, 22 and 23 are formed in the upper surface of chip 20 by any desired process. A further P type region 23a, which is inactive, may enclose the periphery of region 23. Regions 21, 22, 23 and 23a can be boron-diffused regions of sufficient concentration so that the sheet resistance of the P regions will be about 1,600 ohms per square at the chip surface. They may also be formed, for example, by an ion implantation and drive-diffusion process employing $5 \times 10^{+13}$ boron atoms per square centimeter dose so that it is relatively lightly doped. Region 21 is preferably more heavily doped than the other P regions. Regions 21, 22, 23 and 23a may have the same depth of approximately 4 microns. P type region 23 contains an N(+) region 24 to complete the laterally spaced junctions of the lateral thyristor.

The facing edges of regions 21 and 23 should be as close together as possible while still being able to block a selected voltage. In the present application, the device preferably blocks about 400 to 500 volts and a spacing of 105 microns is used.

Region 21 is the anode region, region 23 is the gate or base region, region 24 is the emitter or cathode region while the N(– –) body 20 is the main blocking region of the thyristor shown in FIG. 1. Region 22 is a known type of floating guard region which permits an increase in the blocking voltage between junctions 21 and 23 to as high as 400 to 500 volts without danger of breakdown at the surface of the chip.

The upper chip surface is covered by a thin silicon dioxide layer 30 which can have a thickness, for example, of about 1 micron. Polysilicon field plates 31 and 32 are formed atop the oxide layer 30 as shown, using conventional polysilicon deposition and masking techniques. The entire upper surface of chip, including the polysilicon field plates, and the oxide 30 is covered with a conventional glassy, phosphorus doped silicon dioxide layer 35. Spaced gaps 36 and 37 of known structure may be placed on either side of the floating guard region 22 to prevent lateral polarization effects within the phosphorus doped oxide layer 35 from interfering with the field distribution at the surface of region 20 adjacent the floating guard region 22.

Suitable openings are formed in the oxide layers 30 and 35 above emitter region 24 and anode region 21 to permit contact to the various regions and field plates. Thus, aluminum cathode electrode 40 and anode electrode 41 are applied to emitter region 24 and anode region 21, respectively, as shown. Other openings which are formed in the oxide layer 35 permit connection from the cathode 40 to the field plate 31 and from the anode 41 to the field plate 32. Both cathode electrode 40 and anode electrode 41 are relatively thin and can, for example, be about 4 microns in thickness.

Region 23a is preferably resistively connected to the cathode 40. Thus, region 23a can be connected to cathode 40 only at spaced points along their peripheries.

The lateral thyristor of FIG. 1 is turned on by injection of carriers from emitter region 24 into gate region 23. Suitable injection can be obtained by applying radiation to the upper surface of the device which will generate carriers (holes) in the body 20. These holes drift to region 23 and are collected by the emitter junction between regions 23 and 24 to act as a base drive to turn the device on. A suitable source of radiation can be the schematically illustrated LED 45 which is arranged to illuminate the surface of the device.

It has been found that a device employing the structure of FIG. 1 is capable of blocking from 400 to 500 volts. During forward conduction, the forward voltage drop was about 1.15 Volts at about 1.5 amperes forward current.

The arrangement of the lateral thyristor of FIG. 1 can be implemented in any number of desired geometries. A particularly efficient geometry is that disclosed in FIGS. 2 to 9 which are now described and show an arrangement in which a plurality of devices, such as that of FIG. 1, are connected in parallel.

Figure 2:
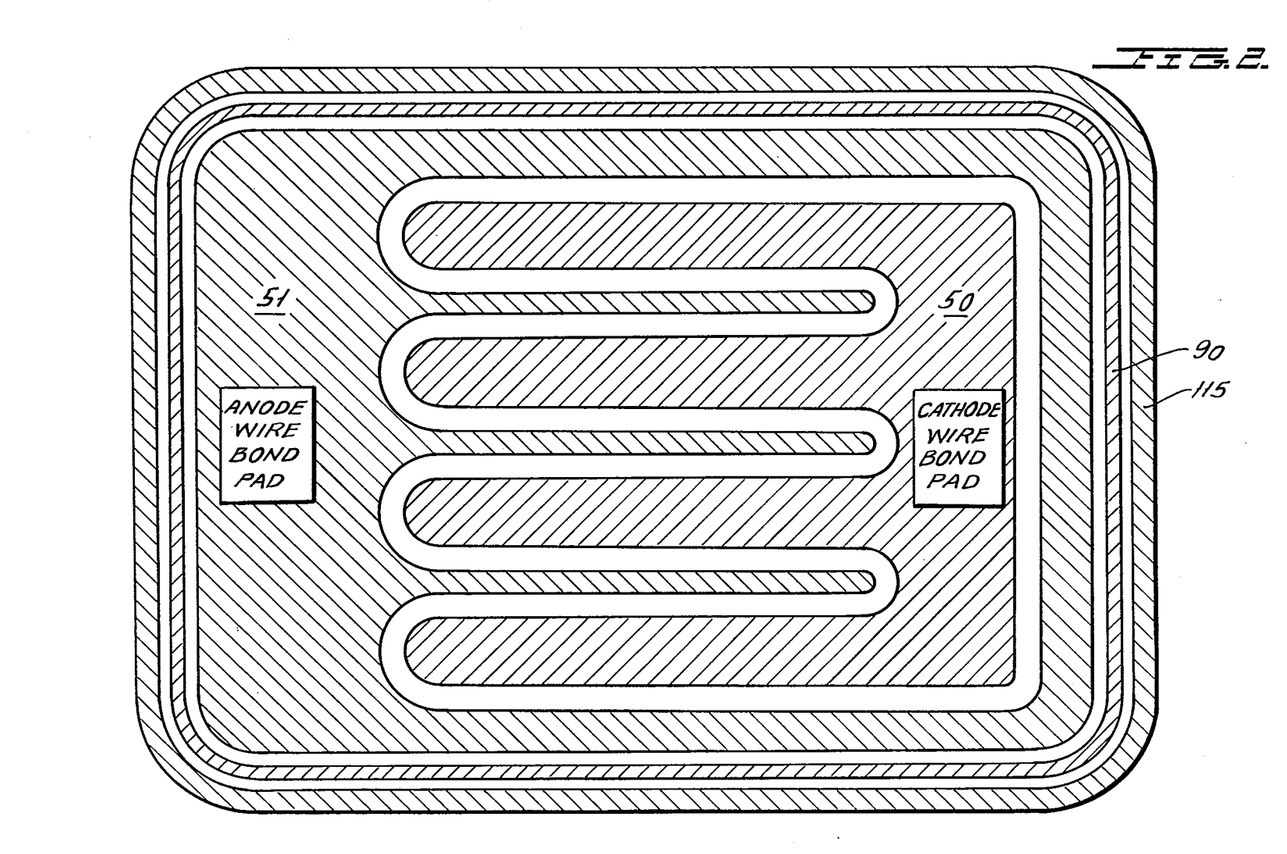
FIG. 2 is a plan view of the metallizing pattern on the surface of a single chip which employs the lateral thyristor of the present invention.
Figure 3:
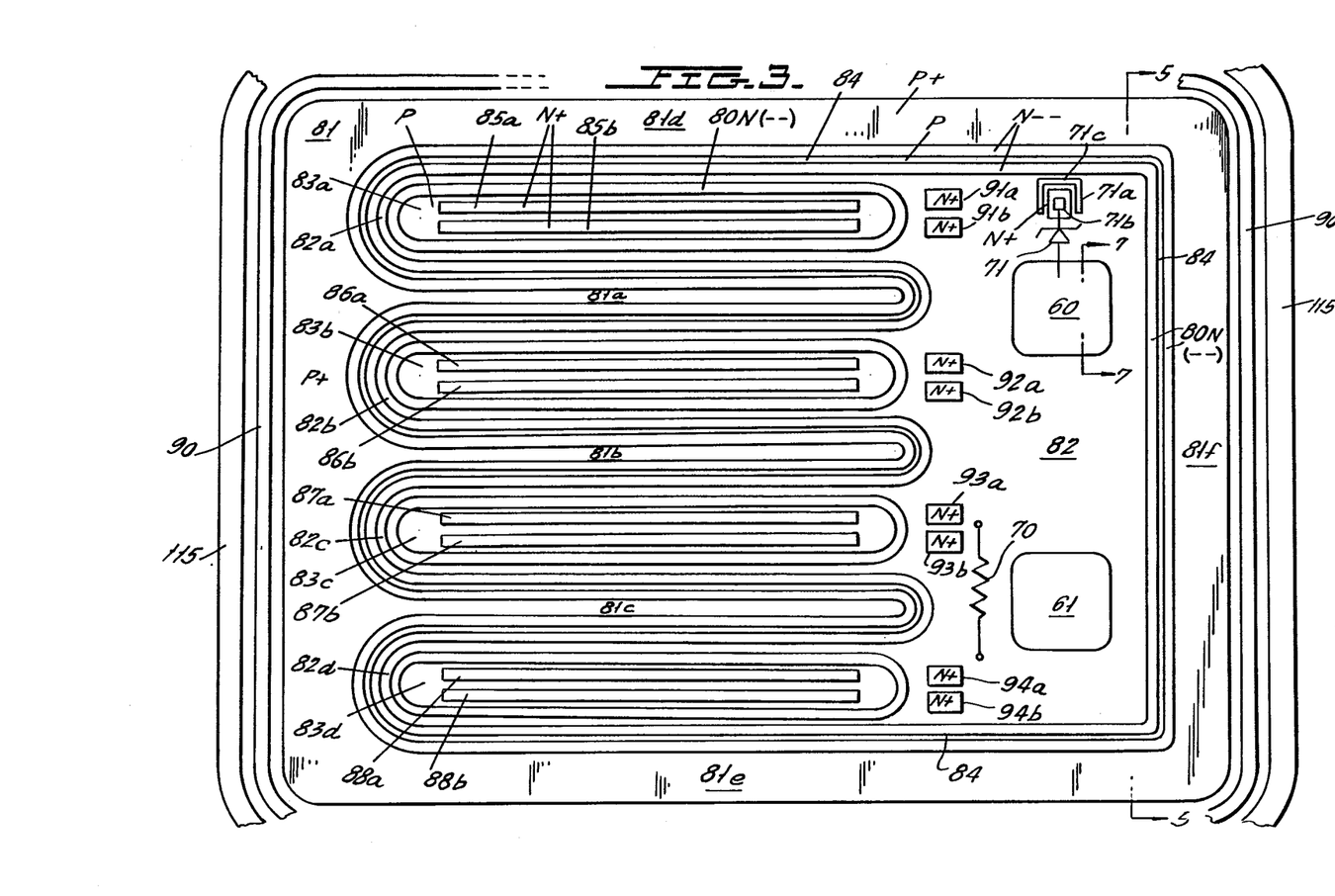
FIG. 3 is a plan view of the silicon surface of the chip of FIG. 2 and shows the junction patterns which come to the device surface.

Referring to FIGS. 2 and 3, there is shown a plan view of a single chip containing a single thyristor device and its control circuit components. The chip of FIGS. 2 and 3 is one of a large number of chips on a common wafer which are separated after common processing is completed. The chip is shown in FIG. 2 after metallizing of the cathode and anode terminal electrodes. The junction patterns on the chip surface are shown in FIG. 3. As will be described in detail, a plurality of separate thyristor elements are connected in parallel, using novel junction patterns for the anode, base and emitter regions (FIGS. 3 and 4) which extend along a path hereinafter designated either a serpentine or interdigitated path, so that they will have the longest possible length, thus permitting a high current capacity for the device.

In the embodiment of FIGS. 2 and 3, the chip may have a width of 82 mils, a length of 113 mils and will have a forward current-carrying rating of 1.5 amperes with a 1.15 volts forward voltage drop. The bisymmetrical blocking voltage capability of the device is about 500 volts peak. Therefore, the thyristor chip of the invention can be employed with an identical anti-parallel connected thyristor chip and used in a solid state relay for controlling an a.c. circuit which might have an RMS voltage of up to 280 volts.

Figure 9:
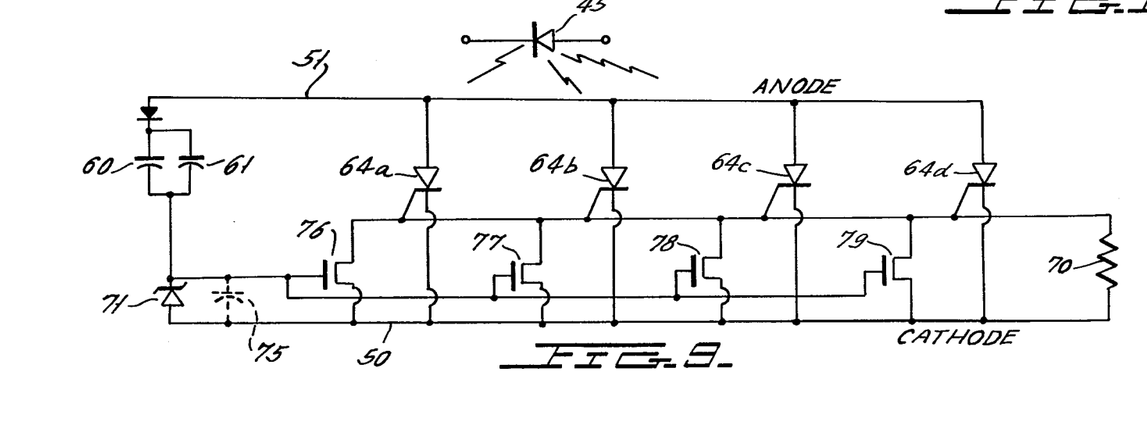
FIG. 9 is a circuit diagram of the thyristor and its control circuit as produced by the junction pattern and interconnections of the device of FIGS. 2 through 8.

The basic metallizing pattern of FIG. 2 employs the cathode 50 and anode 51 configured as shown. A control circuit, not shown in FIG. 2, is contained within the chip body. The circuit is shown in FIG. 9. Metallized sections 60 and 61 in FIG. 3 are electrodes of two respective capacitors shown in FIG. 9. Capacitor 60 will be described later in connection with FIG. 7.

The capacitors including electrodes 60 and 61 are connected in parallel as shown in FIG. 9 and are connected between the anodes of thyristors 64a, 64b, 64c and 64d and gates of control MOSFETS 76, 77, 78 and 79, respectively. Thyristors 64a, 64b, 64c and 64d are in parallel and have common cathodes and anodes, shown as cathode 50 and anode 51 in FIGS. 2 and 6.

Also provided integrally with the chip of FIG. 3 is a 100 K resistor 70 which is formed of polysilicon and is electrically connected between the cathodes and gates of each of thyristors 64a, 64b, 64c and 64d. The detailed structure of resistor 70 will be later described in connection with FIG. 8.

Additionally provided and formed integrally in the chip of FIG. 3 is a zener diode 71 which, as shown in FIG. 9, is connected in series with capacitors 60 and 61 between the anode and cathode terminals 51 and 50 of the thyristors shown. There is also shown in FIG. 9 an inherent distributed capacitance 75 in parallel with zener diode 71.

The zener diode 71 may be formed in the inactive P region 82 and can consist of the N+ region 71a shown in FIG. 3. One zener terminal 71b may be formed directly atop the N+ region 71a, and the other terminal may be formed of a metal contact 71c which is connected to the cathode electrode.

Figure 4:
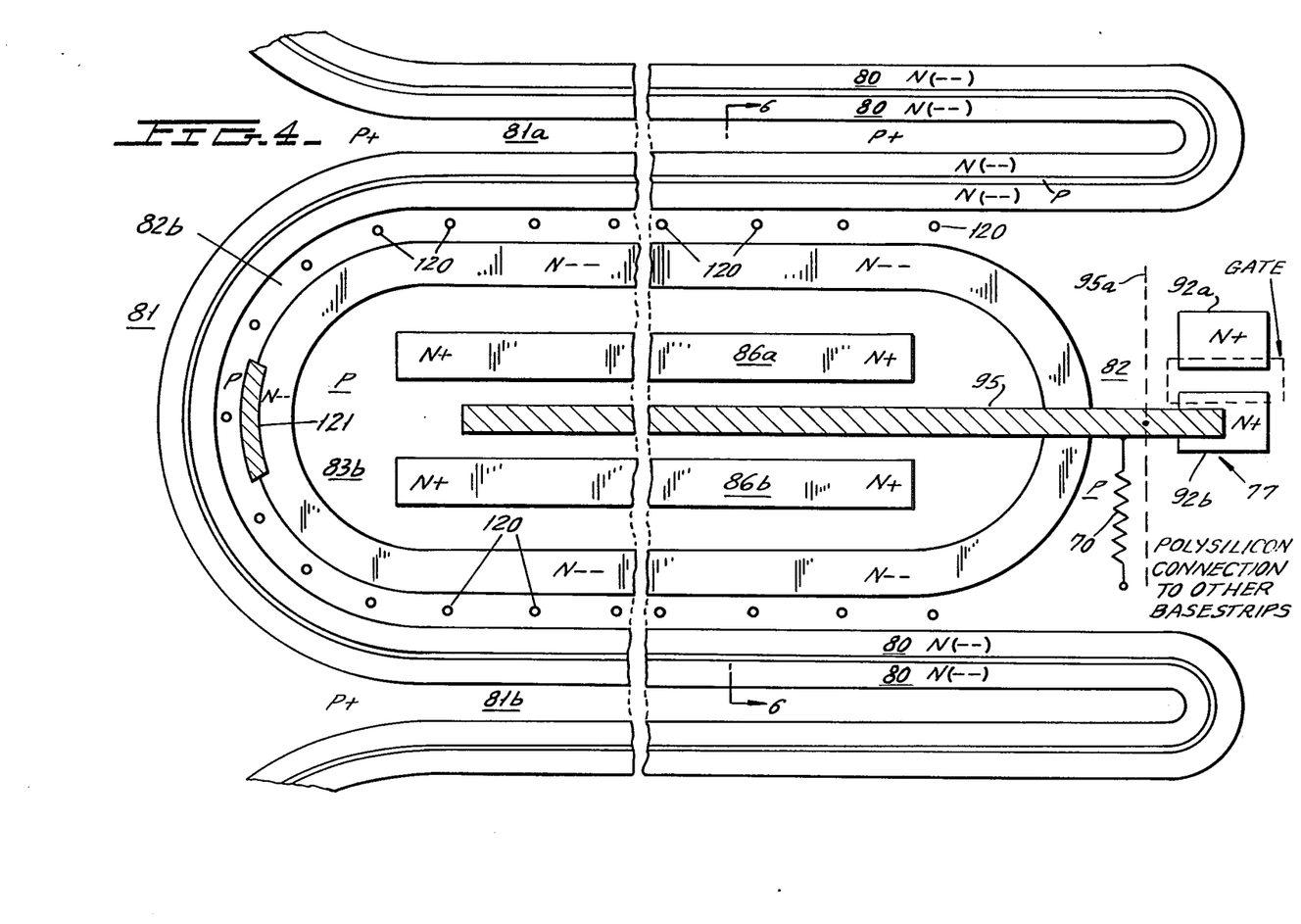
FIG. 4 is an enlarged view of one of the parallel elements or loops of FIG. 3.

A plurality of control MOSFETs 76, 77, 78 and 79, shown in FIG. 9, and which will be later described in FIGS. 3 and 4, are also contained on the chip and operate with thyristors 64a, 64b, 64c and 64d, respectively. Each control MOSFET is disposed immediately adjacent its respective main thyristor element so that operational delay times are limited and circuit symmetry is assured.

The circuit of FIG. 9 is implemented in a novel way, as will now be described in connection with FIGS. 2 to 8. Note that, while the embodiment disclosed herein uses four parallel thyristor elements 64a, 64b, 64c and 64d, any desired number of elements could be used.

Referring to FIGS. 3 to 6, the entire integrated device is formed in a relatively high resistance N(– –) substrate 80 which can have a resistivity of about 20 ohm-centimeters.

Figure 5:
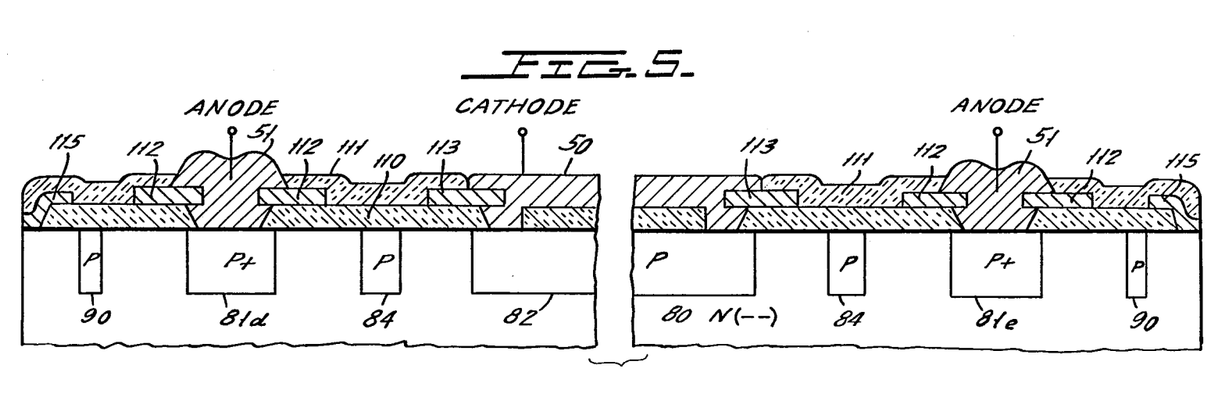
FIG. 5 is a cross-sectional view of FIG. 3 taken across the section line 5—5 in FIG. 3.

A number of individual P type regions are formed in substrate 80 by any desired process. The first of these is the P+ type anode region 81 which corresponds to anode region 21 in FIG. 1. As shown in FIGS. 3 and 4, anode region 81 has a main body section from which three parallel fingers 81a, 81b and 81c extend. FIGS. 81a and 81b are shown in more detail in FIGS. 4 and 6. A rectangular anode region frame having legs 81d, 81e and 81f surrounds the periphery of the chip as shown in FIG. 3. Legs 81d and 81e are seen in FIG. 5.

Figure 6:
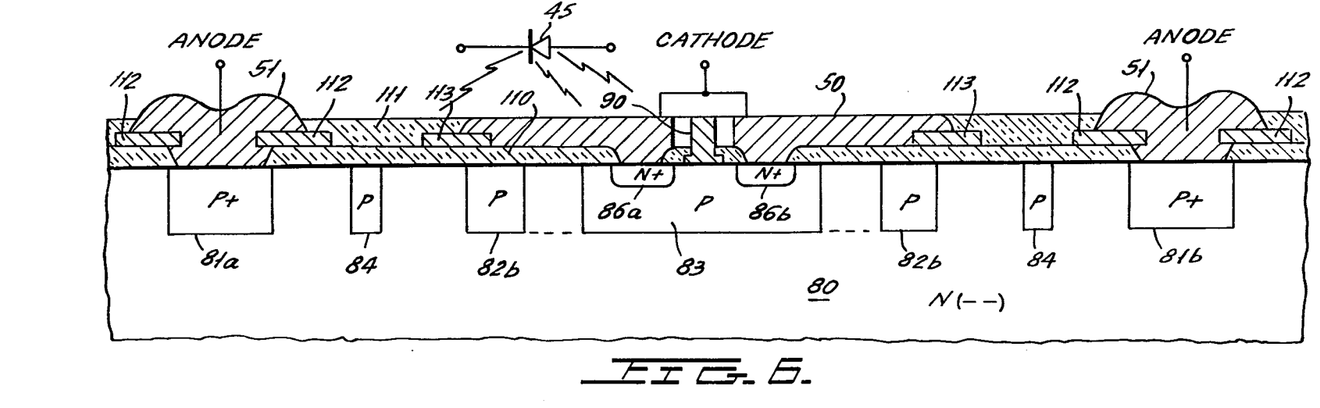
FIG. 6 is a cross-sectional view of FIG. 4 taken across section line 6—6 in FIG. 4.

The second P type region shown in FIGS. 3 to 8 is "inactive" P type auxiliary region 82. Inactive region 82 has loop sections 82a, 82b, 82c and 82d (FIG. 3), which enclose the bases of four respective thyristors as will be later described and serve the purpose of auxiliary ring 23a of FIG. 1. Loop section 82b is shown in FIG. 6.

Four equally spaced, elongated P type base regions 83a, 83b, 83c and 83d (FIGS. 3, 4, and 6) are also found in region 80. These base regions correspond to the base region 23 in FIG. 1. Base region 83b is shown in enlarged detail in FIG. 4. Note that the base regions 83a, 83b, 83c and 83d are almost fully enclosed by auxiliary ring loops 82a, 82b, 82c and 82d, respectively.

A further P type region is formed, consisting of a floating guard ring 84, shown in FIGS. 3 to 6. Guard ring 84 follows a sinuous path and divides in half the N(– –) region 80 which reaches the device surface in FIGS. 3 and 4.

Each of the thyristor bases 83a, 83b, 83c and 83d receives two parallel N+ emitter regions 85a–85b, 86a–86b, 87a–87b and 88a–88b, respectively (FIGS. 3, 4 and 6). Emitter regions 86a and 86b are shown in enlarged detail in FIG. 4.

From the above, it will be seen that the junction pattern in FIG. 3 forms the basis for the four thyristor elements 64a, 64b, 64c and 64d of FIG. 9 and makes possible the parallel connection of the devices.

The thyristor element defining thyristor 64b is shown in FIGS. 4 and 6 and is now described. The thyristor base consists of active P region 83b containing parallel emitter regions 86a and 86b. The thyristor anode region is comprised of the anode region fingers 81a and 81b which symmetrically enclose the base 83b. The thyristor body consists of the N(– –) region 80. The base is also almost completely surrounded by auxiliary loop region 82b which has the benefit previously described of increasing collection efficiency. The novel junction pattern also makes possible the parallel connection of the plural thyristors on the chip.

In forming the junction pattern shown, the lateral spacing between the configuration edges of base regions 83a, 83b, 83c and 83d and the respective adjacent anode fingers 81a, 81b and 81c (and the outer anode legs 81d and 81e) was about 105 microns. The depth of each of the P type regions was about 4 microns. Each of base regions 83a, 83b, 83c and 83d had a length of about 40 mils and a width of about 75 microns.

During the formation of the various P regions, a further P type guard ring 90 (FIGS. 2 and 5) is preferably formed around the periphery of the chip. Ring 90 is spaced from the outer periphery of the P+ anode 81e by about 38 microns.

Also during the formation of the various junctions, and as shown in FIGS. 3 and 4, N(+) source and drain regions 91a–91b, 92a–92b, 93a–93b and 94a–94b are formed for the control MOSFETs 76, 77, 78 and 79, respectively, in FIG. 9. These are formed in the enlarged inactive P type region 82. As is shown in FIG. 4 for the case of control MOSFET 77, a suitable gate oxide having a thickness of about 0.1 micron, and a polysilicon gate electrode (not shown) are arranged over the gap between regions 92a and 92b. An extremely thin oxide can be used for the control MOSFETs because the gate is at the potential of the node between capacitors 60 and 61 and capacitor 75. Thus, the potential difference between the control MOSFET gates and the cathode of the main thyristors is very low. Therefore, transistors 76 to 69 can be very high gain transistors.

The source region 92a is connected to the inactive base, while drain region 92b is electrically connected to the thyristor base region 83b through the conductive strip 95 (FIGS. 4 and 6). Strip 95 is preferably metal. A similar arrangement is provided for each of the thyristor elements with a conductive strip connecting bases 83a, 83b, 83c and 83d to control MOSFET source electrodes 91b, 92b, 93b and 94b, respectively. The conductive strips are then all connected together as by a polysilicon connection strip, partly schematically shown in FIG. 4 by dotted line 95a.

Figure 7:
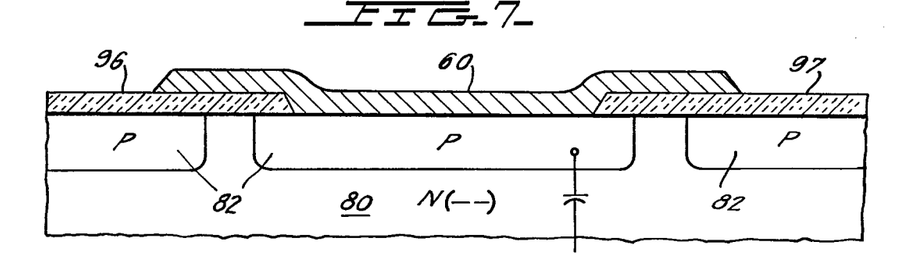
FIG. 7 is a cross-sectional view of FIG. 3 taken across section line 7—7 in FIG. 3.

Capacitors 60 and 61 are also implemented in the inactive P region 82 as shown in FIG. 7 for capacitor 60. Thus, capacitor 60 is formed by depositing a metal layer atop an area of the P type base 82 which s isolated from the chip by causing a rectangular ring 96 having appropriately radiused corners and of the N(– –) material 80 to reach the chip surface. Note that the metal layer 60 overlies thermal oxide layer 97 to form a field plate.

Figure 8:
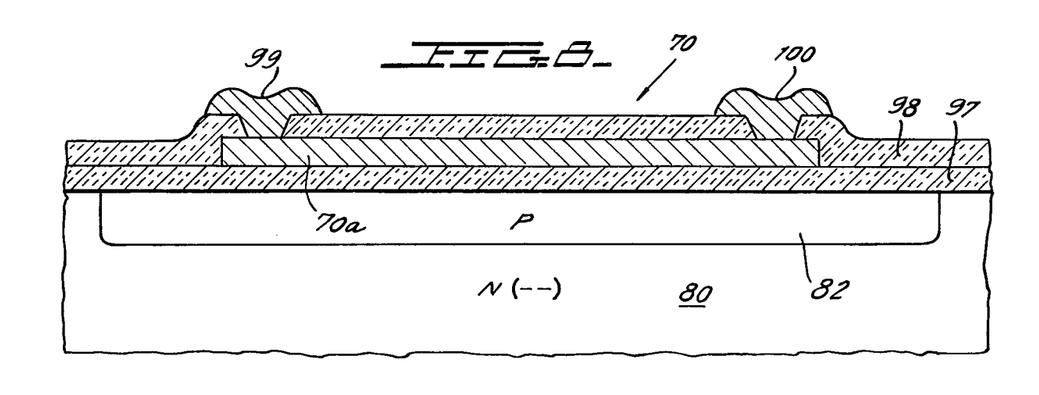
FIG. 8 is a cross-sectional view of the polysilicon resistor which is shown in FIG. 3.

The resistor 70 is also implemented in inactive P type region 82 as shown in FIG. 8. Thus, in FIG. 8, a polysilicon strip 70a is deposited atop oxide layer 97 and is overcoated with a deposited silicon dioxide layer 98. Therefore, resistor 70 is formed of a resistive layer which is completely insulated from the chip body by insulation layer 97. The resistor is thus an ideal resistor which will be free of parasitic interaction with other circuit components. Openings are then formed in layer 98 and resistor terminal connections 99 and 100 are made to the resistor. These terminals are appropriately connected to the thyristor cathode and to the source electrodes of control MOSFETs 76, 77, 78 and 79.

The upper surface of the chip shown in FIGS. 5 and 6 is further processed to have the desired metallizing. Before metallizing, an appropriate thermal oxide 110 exists in place, or is applied to the device surface to a thickness of about 1 micron. After conventional masking and etching steps, metals are applied in the necessary sequence. The upper surface is then covered with a deposited oxide coating 111 which may have any desired thickness.

Novel polysilicon field plates 112 and 113 are deposited on the thermal oxide 110. Note that all polysilicon strips or layers may be deposited in any desired sequence.

Field plate 112 is an elongated, sinuous plate which is disposed atop and follows the path of the junction between P(+) anode region 81 and N(− −) region 80. Field plate 113 similarly is an elongated, sinuous plate which follows a path parallel to that of plate 112 and overlies the junction between auxiliary region 82 and the outwardly disposed N(− −) region 80.

At the time field plates 112 and 113 are deposited, an outer equipotential ring 115 (FIG. 5) may also be disposed around the outer periphery of the chip. Ring 115 is connected to substrate 80 in the usual manner.

Each of field plates 112 and 113 and ring 115 may have a width of about 20 microns. The guard ring region 84 may have a width of about 8 microns and is centrally located between the opposing edges of plates 112 and 113 which edges are about 44 microns apart. Similarly, P type region 90 (FIG. 5) is centrally located between plates 112 and 115, the edges of which are about 44 microns apart.

The anode electrode 51 is then formed as shown and engages the P type anode region 81, as shown in FIGS. 2 and 6. Cathode electrode 50 is also formed as shown in FIGS. 2, 5 and 6.

The lateral thyristor of FIGS. 2 through 9 is turned on by radiation from LED 45 (FIGS. 6 and 9) which is arranged to illuminate the exposed surface of the chip. Since the chip is extremely sensitive, the LED 45 is not critical in size, output or location.

The patterns described in FIGS. 2 through 8 will form the electrical circuit shown in FIG. 9 and define one-half of the solid state relay which is disclosed in copending application Ser. No. 451,792 now U.S. Pat. No. 4,535,251. As is fully described in that application, the chip and control circuit of FIG. 9 can be connected in anti-parallel relation with an identical chip to define a solid state relay. Turn-on of the thyristor is clamped against firing by transients when no light is present. Voltage division obtained between capacitors 60–61 and 75 defines the voltage window at which turn-on is possible. Significantly, the capacitive voltage divider permits a very low gate voltage for the control transistors and very low function leakage current. The capacitors also provide shielding from input light or radiation.

The novel lateral thyristor shown in FIGS. 2 to 8 can be made by any desired process. The device provides a maximum effective current carrying area between the anode region 81 and the base region 83 for a given chip area. The pattern configuration is also arranged to reduce forward voltage drop to as large a degree as possible while maintaining high light sensitivity so that the LED 45 is not critical.

A significant feature of the novel geometry is the novel P type auxiliary regions 82a, 82b, 82c and 82d which loop around each base region 83a, 83b, 83c and 83d, respectively. This geometry makes it possible to connect together all N+ cathodes. Thus, regions 82a, 82b, 82c and 82d and main region 82 are constant potential regions in which all thyristor bases are embedded. By spreading out into region 82 at the ends of the bases, a large area is made available for metallizing to connect regions in parallel.

Preferably, a resistive connection is made from the cathode 50 to the loops 82a, 82b, 82c and 82d as by using spaced dot type connections, schematically shown as connection points 120 in FIG. 4, extending along the length of the P type loop 82b. The connection can also be made by a short contact strip 121, shown in FIG. 4. By using a resistive connection between the auxiliary loops and the cathode electrode 50, and as shown in FIGS. 4 and 6, carriers which are injected from the anode regions 81a and 81b during turn-on of the device will tend to move to the emitter regions 86a and 86b rather than being collected by the auxiliary regions 82a, 82b, 82c and 82d. This increases the collection efficiency of the emitter and substantially decreases the forward voltage drop of the device. By way of example, by making the resistive connection between auxiliary loop regions and cathode 50, the forward voltage drop at 1.5 amperes forward current was reduced from about 1.45 volts to about 1.15 volts. This results in a significant reduction of power dissipation during forward conduction.

During processing of the device of FIGS. 3 to 6, the anode region 81 and all its segments are preferably heavily doped as compared to the doping of P type regions 82, 83 and 84. By way of example, anode region 81 can be doped to the point where it has a resistivity of 50 ohms per square as compared to 1600 ohms per square for regions 82, 83 and 84. This sets a high gain and thus high light sensitivity for the inherent lateral transistor consisting of regions 81, 80 and 83. Furthermore, by more heavily doping the anode region, the forward voltage drop of the device is reduced.

A further important feature of the invention lies in the control of the doping of the emitter regions, such as regions 86 and 86b in FIGS. 3 and 6, so that the N type concentration at the surface of the device is at an optimum value of $1 \times 10^{20}$ to $6 \times 10^2$ phosphorus ions/cc. This can be done as by diffusing phosphorus through a thin oxide during the formation of the regions 86 or by control of the various gas flows during the diffusion process. By reducing the N type concentration at the surface of regions 86, the injection efficiency of the device is improved, thus further reducing the forward voltage drop and substantially increasing the sensitivity of the device to turn-on by photons from the source 45.

Although the present invention has been described in connection with preferred embodiments thereof, many variations and modifications will now become apparent to those skilled in the art. It is preferred, therefore, that the present invention be limited not by the specific disclosure herein, but only by the appended claims.

What is claimed is:

1. A lateral thyristor which is optically fired comprising a chip of semiconductor material having a pn junction-receiving layer of one conductivity type; a first emitter region of an opposite conductivity type and a base region of said opposite conductivity type each formed into said layer and laterally spaced from one another; a second emitter region of said one conductivity type formed in and totally contained within said base region and extending therein from a surface of said layer; first and second electrodes connected to said first and second emitter regions, respectively, and radiation means for illuminating at least a portion of said surface for turning on said thyristor; an auxiliary region of said opposite conductivity type extending only part way into said layer and being laterally and adjacently spaced from and surrounding substantially the full periphery of said base region; and means for resistively connecting in permanent fashion said auxiliary region to said second electrode, and a guard ring of said opposite conductivity type formed into said layer and being disposed between and laterally spaced from said first emitter and base regions; said guard ring being out of contact with said first and second electrodes and floating electrically with respect to said electrodes.

2. The lateral thyristor of claim 1 wherein said second emitter region, said base region and said guard ring comprise respectively elongated portions.

3. A later thyristor which is optically fired comprising a chip of semiconductor material having a pn junction-receiving layer of one conductivity type and of a given resistivity; a first emitter region of an opposite conductivity type and a base region of said opposite conductivity type each formed into said layer and laterally spaced from one another; a second emitter region of said one conductivity type formed in and totally contained within said base region and extending therein from a surface of said layer; first and second electrodes connected to said first and second emitter regions, respectively, and readiation means for illuminating at least a portion of said layer for turning on said thyristor; an auxiliary region of said opposite conductivity type extending only part way into said layer and laterally spaced from and surrounding said base region; and means for resistively connecting in permanent fashion said auxiliary region to said second electrode.

4. The thyristor of claim 3 wherein said first emitter region if more heavily doped than said base region in order to reduce the forward voltage drop and increase light sensitivity.

5. The thyristor of claim 3, or 4 which further includes a guard ring of said opposite conductivity type formed into said layer and disposed between and laterally spaced from said first emitter and base regions; said guard ring being out of contact with said first and second electrodes and floating electrically with respect to said electrodes.

6. The lateral thyristor of cliam 5 wherein said second emitter region, said base region and said guard ring comprise elongated portions that are parallel to each other.

7. A lateral thyristor which is optically fired comprising a chip of semiconductor material having a pn junction-receiving layer of one conductivity type and of a given resistivity; a first emitter region of an opposite conductivity type and a base region of said opposite conductivity type each formed into said layer and laterally spaced from one another; a second emitter region of said one conductivity type formed in and toally contained within said base region and extending therein from a surface of said layer; first and second electrodes connected to said first and second emitter regions, respectively, and radiation means for illuminating at least a portion of said layer for turning on said thyristor; an auxiliary region of said opposite conductivity type extending only part way through said layer and laterally spaced from and surrounding substantially the full lateral periphery of said base region; and means for resistively connecting in permanent fashion said auxiliary region to said second electrode; said base region having an elongated shape terminating at said layer; said second emitter regio comprising at least one elongated rectangular shape contained within said base region; said first emitter region having a digitated pattern, the entirety of said elongated base region being situated between adjacent fingers to said digitated first emitter pattern.

8. The thyristor of claim 7 wherein said first emitter region is more heavily doped than said base region in order to reduce the forward voltage drop and increase light sensitivity.

9. The thyristor of claim 7 or 8 which further includes a guard ring of said opposite conductivity type formed into said layer and disposed between and laterally spaced from said first emitter and base regions; said guard ring being out of contact with said first and second electrodes and floating electrically with respect to said electrodes.

10. The lateral thyristor of cliam 1 which further includes a conductive field plate disposed along the periphery of said first emitter region.

11. A lateral thyristor which is optically fired comprising a chip of semiconductor material having a pn junction-receiving layer of one conductivity type and of a given resistivyt; a first emitter region of an opposite conductivity type and a base region of said opposite conductivity type each formed into said layer and laterally spaced from one another; a second emitter region of said one conductivity type formed in and totally contained within said base region and extending therein from said layer; first and second electrodes connected to said first and second emitter regions, respectively, and radiation means for illuminating at least a portion of said layer for turning on said thyristor; an auxiliary region of said opposite conductivity type extending only part way into said layer and laterally spaced from and surrounding substantially the full periphery of said base region; means for resistively connecting in permanent fashion said auxiliary region to said second electrode and a guard ring of said opposite conductivity type formed into said layer and being disposed symmetrically between and laterally spaced from said first emitter and auxiliary regions; said guard ring being out of contact with said first and second electrodes and floating electrically with respect to said electrodes.

12. The lateral thyristor of claim 11 wherein said second emitter region, said base region and said guard ring comprise respective elongated and parallel regions.

13. The thyristor of claim 11 which further includes first field plate means disposed above and coextensive with said second electrode and second field plate means disposed above and coextensive with said first emitter region and connected to said first electrode.

14. An optically triggered thyristor comprising, in combination:
- a substrate of semiconductor material of one conductivity type and of a given resistivity;
- at least first and second elongated, spaced, and parallel base regions of an opposite conductivity type extending into the layer of the substrate;
- respective auxiliary regions of said opposite conductivity type extending only part way into the layer of said substrate and respectively laterally spaced from and surrounding substantially the full lateral peripheries of said base regions;
- respective first emitter regions of said one conductivity type extending into said layer of at least first and second parallel base regions and being completely contained within their said respective base regions;
- respective elongated second emitter regions of said opposite conductivity type extending into said substrate and respectively disposed on opposite elongated sides of, laterally spaced from, and situated parallel to each of said parallel base regions; said base region being situated between respective second emitter regions;
- a first electrode connected to said first emitter regions;
- a second electrode connected to said second emitter region;

means for resistively connecting in permanent fashion said auxiliary regions to said first electrode; said radiation generating means energizable to generate minority carriers in said substrate which act as a base drive to turn on said thyristory when appropriate bias voltages are applied to said first and second electrodes.

15. The thyristor of claim 14 wherein said second emitter regions consist of parallel elongated fingers extending from an enlarged area of said opposite conductivity type which extends into said substrate layer and which is disposed adjacent one of the ends of said base region.

16. The thyristor of claim 14 which includes a plurality of auxiliary regions of said opposite conductivity type which extend into said substrate layer and which loop around and are laterally spaced from the elongated sides and one end of respective ones of said base regions and being disposed between their respective bases and said elongated second emitter regions associated therewith.

17. The thyristor of claim 16 wherein said plurality of auxiliary regions extend from an adjoining region of said other of said conductivity types which is disposed adjacent respective commonly-oriented ends of said base regions.

18. The thyristor of claim 17 wherein a plurality of control devices are integrated into said thyristor in the region of said enlarged region of said auxiliary region, said control devices being electrically coupled to said first emitter regions and providing a signal to such regions controlling turn-on of said thyristor.

19. The thyristor of claim 15 which includes a plurality of auxiliary regions of said opposite conductivity type which extend into said substrate layer and which loop around and are laterally spaced form the elongated sides and one end of respective ones of said base regions and being disposed between their respective bases and said elongated anode regions associated therewith.

20. The thyristor of claim 19 wherein said plurality of auxiliary regions extend from an adjoingin region of said other of said conductivity types which is disposed adjacent respective commonly-oriented ends of said base regions; said adjoining region and said enlarged area of said anode region being disposed adjacent opposite ends of said base regions.

21. The thyristor of claim 14 wherein said elongated second emitter regions and said plurality of base regions are separated from one another by a continuous, elongated, serpentine strip of said material of said one conductivity type.

22. The thyristor of claim 20 wherein said elongated anode regions and said plurality of base regions are separated from one another by a continuus, elongated serpentine strip of said material of said one conductivity type.

23. The thyristor of claim 21 or 22 which further includes a guard ring of said opposite conductivity type which is disposed centrally of and is coextensive with said elongated serpentine strip and which extends into said substrate layer.

24. The thyristor of claim 21, or 22 which further includes first and second field plates which are spaced from one another and are disposed above and are coextensive with the opposite edges of said elongated serpentine strip.

25. The thyristor of claim 14, 15, 16 or 17 which further includes a respective control transistor for each of said at least first and second base regions; each respective control transistor comprising spaced source and drain regions extending into said layer of said substrate and laterally spaced from their respective said base regions; and contact means supported on said substrate and electrically connecting each of said base regions to said drain region of their respective control transistors; said drain regions of each of said control transistors connected to said first electrode; respective gate insulation layers overlying said substrate in the space between said source and drain regions of each of said control transistors; and gate electrode means atop each of said gate insulation layers.

26. The thyristor of claim 25 which further includes first and second capacitors formed on said substrate and connected in series between said first and second electrodes and defining a capacitive divider; said gate electrode means of said control transistors connected to a node between said first and second capacitors; said first and second capacitors being sized to apply only a small fraction of the voltage between said first and second electrodes between said gate electrode means and said substrate, whereby said gate insulation layer can be very thin and of the order of 0.1 micron.

27. The thyristor of claim 26 wherein said first capacitor is a distributed capacitance and said second capacitor consists of a capacitor junction in said substrate and a capacitor electrode atop said capacitor junction; said capacitor electrode connected to said second electrode.

28. The thyristor of claim 26 which further includes zener diode means formed in said substrate and connected between said node between said first and second capacitors and said cathode electrode.

29. The thyristor of claim 28 wherein said first capacitor is a distributed capacitance and said second capacitor consists of a capacitor junction in said substrate and a capacitor electrode atop said capacitor junction; said capacitor electrode connected to said second electrode.

30. The thyristor of claim 25 which further includes integral resistor means connected across said source and drain regions of each of said control transistors; said resistor means including a stirp of polysilicon deposited atop a given region of said substrate; a layer of silicon dioxide disposed between said given region of said substrate and said strip of polysilicon, said polysilicon strip being spaced in its entirety from said substrate by said layer of silicon dioxide, whereby said resistor is electrically isolated from parasitic currents in said substrate; and first and second terminals extending from spaced points on said polysilicon strip; said first terminal connected to each of said contact means which are connected to said bases; said second terminal connected to said first electrode respectively.

31. The thyristor of claim 29 which further includes integral resistor means connected across said source and drain regions of each of said control transistors; said resistor means including a strip of polysilicon deposited atop a given region of said substrate; a layer of silicon dioxide disposed between said given region of said substrate and said strip of polysilicon, said polysilicon strip being spaced in its entirety from said substrate by said layer of silicon dioxide, whereby said resistor is electrically isolated from parasitic currents in said substrate; and first and second terminals extending from spaced points on said polysilicon strip; said first terminal connected to each of said contact means which are connected to said bases; said second terminal connected to said first electrode respectively.

* * * * *